(12) United States Patent
Taniguchi

(10) Patent No.: US 6,943,645 B2
(45) Date of Patent: Sep. 13, 2005

(54) SURFACE ACOUSTIC WAVE DUPLEXER AND COMMUNICATION APPARATUS HAVING THE SAME

(75) Inventor: Norio Taniguchi, Shiga-ken (JP)

(73) Assignee: Murata Manufacturing Co., LTD, Kyoto (JP)

(*) Notice: Subject to any disclaimer, the term of this patent is extended or adjusted under 35 U.S.C. 154(b) by 0 days.

(21) Appl. No.: 10/423,860

(22) Filed: Apr. 28, 2003

(65) Prior Publication Data

US 2003/0214368 A1 Nov. 20, 2003

(30) Foreign Application Priority Data

May 16, 2002 (JP) .................................. 2002-141735

(51) Int. Cl.$^7$ .................................................. H03H 9/64
(52) U.S. Cl. ..................... 333/133; 333/195; 333/198
(58) Field of Search ......................... 333/13, 17.2, 124, 333/133, 195, 198

(56) References Cited

U.S. PATENT DOCUMENTS

| | | | |
|---|---|---|---|
| 5,933,062 A | * | 8/1999 | Kommrusch ................. 333/193 |
| 6,222,426 B1 | * | 4/2001 | Komazaki et al. ........... 333/133 |
| 6,731,185 B2 | * | 5/2004 | Taniguchi .................... 333/133 |

FOREIGN PATENT DOCUMENTS

| | | |
|---|---|---|
| EP | 0 541 284 A1 | 5/1993 |
| GB | 2 378 067 A | 1/2003 |
| JP | 5-167388 A | 7/1993 |
| JP | 9-167937 A | 6/1997 |
| JP | 10-065490 | 3/1998 |
| JP | 10-313229 | 11/1998 |

* cited by examiner

Primary Examiner—Timothy P. Callahan
Assistant Examiner—An T. Luu
(74) Attorney, Agent, or Firm—Keating & Bennett, LLP (57) ABSTRACT

A surface acoustic wave duplexer includes a first filter including a ladder filter and a second filter including a ladder filter with a pass band that is different from that of the first filter. Inductors are connected in parallel with respective series resonators of both first and second filters.

25 Claims, 11 Drawing Sheets

SURFACE ACOUSTIC WAVE DUPLEXER AND COMMUNICATION APPARATUS HAVING THE SAME

BACKGROUND OF THE INVENTION

1. Field of the Invention

The present invention relates to a surface acoustic wave (hereinafter, referred to as "SAW") duplexer including a SAW resonator, for use in, for example, cellular phones, and relates to a communication device having the same.

2. Description of the Related Art

Recently, in small wireless communication apparatuses, such as cellular phones, a duplexer has been used for branching and sorting transmission/reception signals. In view of the demand for miniaturization, reduced weight, and sophistication of the communication apparatus, the components of the duplexer are required to be miniaturized and sophisticated as well. This has led to most recent filters using SAW elements.

Figure 10:
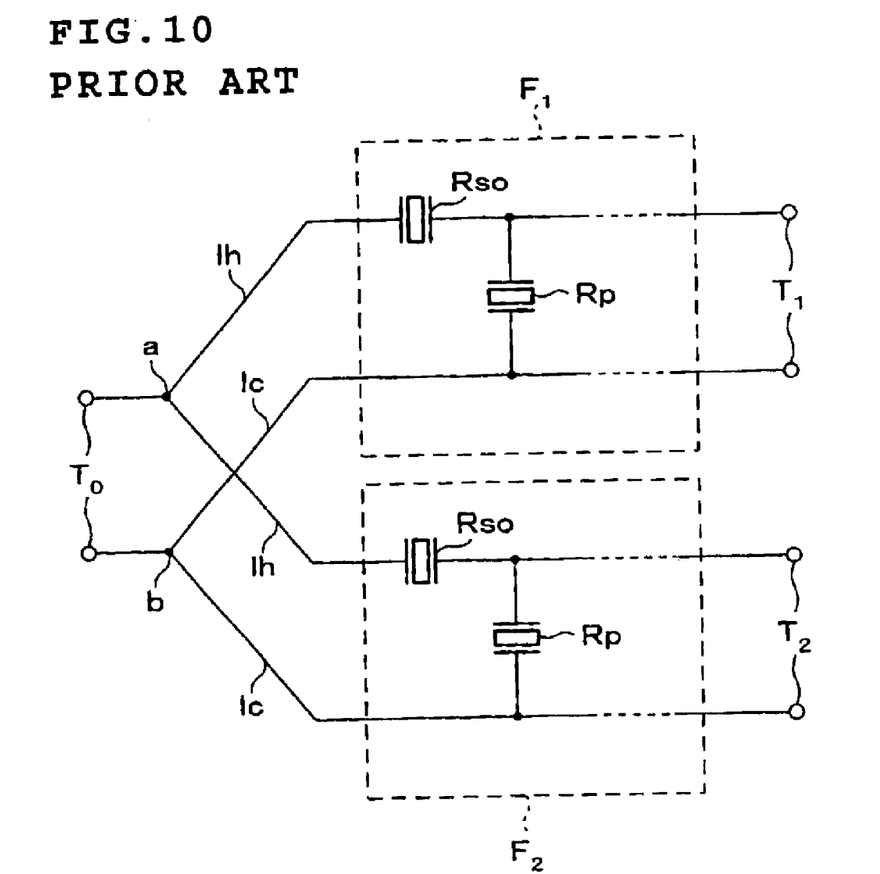
FIG. 10 is a circuit diagram showing a known SAW duplexer.

As such a filter, a ladder filter obtained by combining SAW resonators into a ladder configuration is used. Such a ladder filter has an advantage in that it can decrease insertion loss. In Japanese Unexamined Patent Application Publication No. 5-167388 (a known example 1), there is disclosed a circuit construction in which, as shown in FIG. 10, the above-described ladder filter is used both in the transmission side and reception side to provide a duplexer construction.

Figure 11:
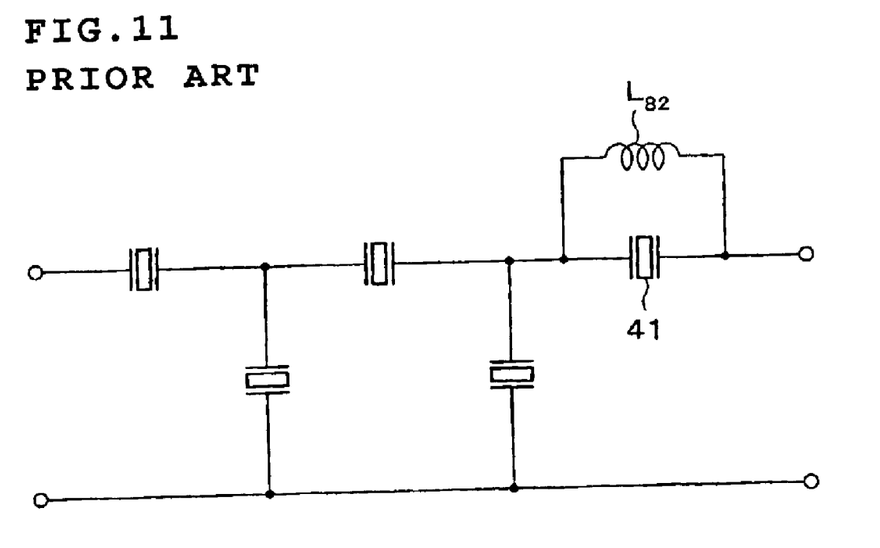
FIG. 11 is a circuit diagram showing another known SAW duplexer.

Furthermore, in Japanese Unexamined Patent Application Publication No. 9-167937 (a known example 2), there is disclosed a surface acoustic wave filter in which, as shown in FIG. 11, an inductor $L_{82}$ is connected in parallel with a series resonator 41 at the output side of the ladder filter to realize great attenuation over the out-of-pass-band.

However, the construction of the above-described known example (1) is a common ladder filter without any particular feature for achieving characteristic improvement. This causes the attenuation to be determined by the capacitance ratio of the series resonators to the parallel resonators, which has a tradeoff relationship between the attenuation and the loss. Therefore, the known example (1) has a loss deterioration problem, particularly in the duplexer required for high attenuation.

In the known example (2) is disclosed the construction in which the parallel inductor is connected to a single unit of the ladder filter. The construction is, however, assumed exclusively for the single unit of the ladder filter, and when it is used in the duplexer, there is no consideration of the characteristic deterioration thereof. Particularly in the known example (2), there are disclosed, as a method to form the inductor, examples in which the inductors are formed using a micro-strip line and/or a bonding wire disposed on a SAW chip that makes the ladder filter. In the duplexer having two different frequency pass-bands with the inductors thus formed, mutual interference cannot be ignored, causing deterioration in attenuation and isolation.

SUMMARY OF THE INVENTION

In order to overcome the problems described above, preferred embodiments of the present invention provide a SAW duplexer that can ensure preferable loss and attenuation.

To this end, according to a first preferred embodiment of the present invention, a surface acoustic wave duplexer includes a first filter including a plurality of surface acoustic wave resonators having a ladder configuration, a second filter including a plurality of surface acoustic wave resonators having a ladder configuration, the surface acoustic wave resonators are preferably provided on a piezoelectric substrate, the second filter having a pass band that is different from that of the first filter, and an inductor connected in parallel with one of the resonators that is not closest to the output side of the first filter and that is not closest to the input side of the second filter. In the surface acoustic wave duplexer, the first filter is disposed at the transmission side and the second filter is disposed at the reception side.

This construction enables mutual interference between transmission/reception signals having frequencies that are close but different, such as those of a cellular phone, to be suppressed by separating them since the pass bands of the first filter and the second filter are different.

The inductor is connected in parallel with one of the resonators in the first and second filters that is not closest to the antenna. This achieves preferable out-of-band attenuation and prevents interference with the other. Therefore, this construction facilitates matching between the transmission side and the reception side.

According to a second preferred embodiment of the present invention, a surface acoustic wave duplexer includes a first filter having a plurality of surface acoustic wave resonators including a series resonator and a parallel resonator having a ladder configuration, a second filter including a plurality of surface acoustic wave resonators including a series resonator and a parallel resonator having a ladder configuration, the surface acoustic wave resonators are preferably provided on a piezoelectric substrate, the second filter having a pass band different from that of the first filter, a first inductor connected in parallel with one of the series resonators of the first filter, and a second inductor connected in parallel with one of the series resonators of the second filter.

Since inductors are connected in parallel with respective series resonators of the first and second filters, preferable out-of-band attenuation can be achieved. In addition, since the inductors are added to both filters, interference between them is prevented and minimized, thus realizing matching between the transmission side and the reception side.

In the SAW duplexer, it is preferable that the first filter is disposed at the transmission side while the second filter is disposed at the reception side and that the first inductor is connected with one of the series resonators that is not closest to the output side of the first filter while the second inductor is connected with one of the series resonators that is not closest to the input side of the second filter.

In the construction, the series resonator of the first filter that is closest to the output side and the series resonator of the second filter that is closest to the input side are on the antenna side. Connecting inductors in parallel with such respective series resonators at the antenna side may cause a problem, such as deterioration in matching between these filters. However, by connecting inductors in parallel with respective series resonators that are not the ones closest to the antenna, the above-mentioned problem can be avoided and preferable out-of-band attenuation can be obtained.

In the SAW duplexer, preferably, a package for accommodating a surface acoustic wave chip is provided, and the first and second piezoelectric substrates are consolidated as one substrate in which the first and second inductors face each other in an inner periphery of the package so as to sandwich the surface acoustic wave chip.

In the SAW duplexer, the first inductor and the second inductor may face each other on inner sides of the package so as to sandwich the surface acoustic wave chip.

In the SAW duplexer, the first inductor and the second inductor may face each other on inner corners of the package so as to sandwich the surface acoustic wave chip.

In the SAW duplexer, it is preferable that the first inductor and the second inductor are disposed outside the mounted portion of the surface acoustic wave chip in the package.

Since the inductors are disposed in the inner periphery, sides, and/or corners with the SAW chip being sandwiched therebetween, a substantial distance between the inductors can be obtained. Therefore, the dielectric coupling and electromagnetic coupling can be minimized and preferable out-of-band attenuation can be obtained more securely.

In the SAW duplexer, it is preferable that an antenna signal terminal is provided in a position of the package where neither the first inductor nor the second inductor is disposed, and a signal transmission terminal and a signal reception terminal are arranged at a location of the package so as to face the antenna signal terminal.

In the SAW duplexer, preferably, the package is a substantially rectangular parallelepiped having shorter sides and longer sides with the antenna signal terminal provided at one of the longer sides, the signal transmission terminal and the signal reception terminal provided at the other longer side, the first inductor is connected in parallel with one of the series resonators of the first filter on one of the shorter sides, and the second inductor is connected in parallel with one of the series resonators of the second filter on the other shorter side.

Since the signal transmission terminal and signal reception terminal are arranged at a position of the package so as to face the antenna signal terminal, mutual interference among the antenna signal, the transmission signal, and the reception signal can be lessened. This prevents deterioration in the filter characteristic.

In the surface acoustic wave duplexer, a wire bonding portion for electrically bonding the package and the surface acoustic wave chip may be provided.

In the surface acoustic wave duplexer, a bump bonding portion for electrically bonding the package and the surface acoustic wave chip may be provided.

In the surface acoustic wave duplexer, preferably, a matching element at an antenna-coupling terminal is provided, the package has a multi-layer structure, and the matching element is provided at a layer lower than the mounted portion of the surface acoustic wave chip in the package.

In the surface acoustic wave duplexer, at least one of the first and second filters may include at least three series resonators.

According to a third preferred embodiment of the present invention, a communication apparatus includes one of the above-described SAW duplexers according to other preferred embodiments of the present invention.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of a SAW duplexer according to the present invention will now be described with reference to FIGS. 1 to 9.

Figure 1:
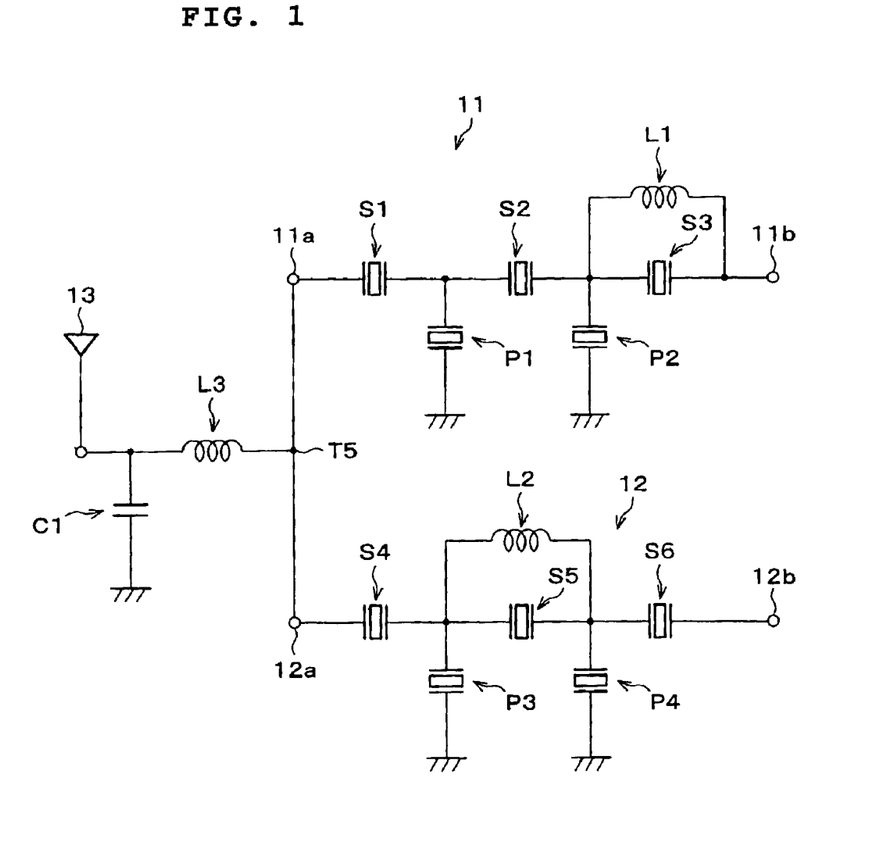
FIG. 1 is a circuit diagram of a SAW duplexer according to a first preferred embodiment of the present invention.

As shown in FIG. 1, the SAW duplexer according to a preferred embodiment of the present invention includes a first filter 11 having a predetermined pass-band and a second filter 12 having another pass-band that is different from that of the first filter 11. Since the first and second filters 11 and 12 have different pass-bands, they can function as, for example, a duplexer that branches waves to the transmission and reception sides having different pass-bands.

The first filter 11 includes a plurality of SAW resonators having a ladder configuration in which three series resonators S1, S2, and S3 are connected in series and two parallel resonators P1 and P2 each connected between each of the series resonators S1, S2 and S3, and the ground are provided.

The second filter 12 includes a plurality of SAW resonators having a ladder configuration in which three series resonators S4, S5, and S6 are connected in series and two parallel resonators P3 and P4 each connected in parallel between the series resonators S4, S5 and S6, and the ground are provided.

The "ladder configuration" indicates that a plurality of SAW resonators is connected to each other into a ladder configuration so that the series connections and the parallel connections alternately appear. In the ladder configuration, the resonant frequency of the SAW series resonator is generally equal to the anti-resonant frequency of a SAW parallel resonator while the resonant frequency of the SAW parallel resonator is lower than that of the SAW series resonator.

These settings allow high selectivity of the pass-band formed between the resonant frequency of the SAW parallel resonator and the anti-resonant frequency of the SAW series resonator, which are attenuation poles. The ladder filter is, therefore, provided with stop bands including the respective attenuation poles at both sides of the pass-band.

In the first filter 11 and the second filter 12, the number and combination of SAW resonators in the ladder can be modified in accordance with a required specification or standard.

Figure 2A:
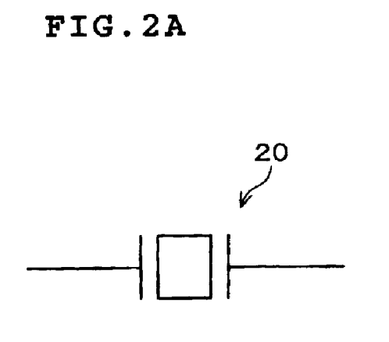
FIG. 2A is a circuit diagram of a SAW resonator used in the SAW duplexer.
Figure 2B:
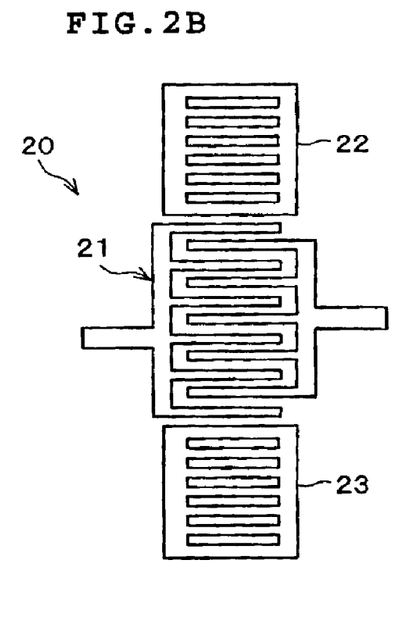
FIG. 2B is a general block diagram of FIG. 2A.

A SAW resonator 20 shown in FIG. 2A includes, as shown in FIG. 2B, interdigital electrode transducers 21 overlapping in the direction that is substantially perpendicular to the propagation direction of the SAW and the reflectors 22 and 23 which sandwich the interdigital electrode transducers 21 from both sides thereof along the propagation direction of the SAW.

The electrode finger parameters (the resonant frequency, number of pairs, and interdigital length) of the SAW resonators 20, which include the resonators S1, S2, S3, S4, S5, S6, P1, P2, P3, and P4, are set as shown in Table 1. In the first preferred embodiment of the present invention, the first filter 11 is a transmission filter, and the second filter 12 is a reception filter.

TABLE 1

|  |  | RESONANT FREQUENCY | NUMBER OF PAIRS | INTERDIGITAL LENGTH |
|---|---|---|---|---|
| FIRST FILTER | S1 | 2075 MHz | 85 pairs | 40 μm |
|  | S2 | 2075 MHz | 100 pairs | 50 μm |
|  | S3 | 2075 MHz | 100 pairs | 120 μm |
|  | P1 | 1975 MHz | 80 pairs | 63 μm |
|  | P2 | 1975 MHz | 80 pairs | 63 μm |
| SECOND FILTER | S4 | 2260 MHz | 90 pairs | 16 μm |
|  | S5 | 2219 MHz | 100 pairs | 22 μm |
|  | S6 | 2219 MHz | 130 pairs | 50 μm |
|  | P3 | 2122 MHz | 90 pairs | 60 μm |
|  | P4 | 2122 MHz | 90 pairs | 60 μm |

In the first filter 11, an inductor L1 (=2.7 nH) is connected in parallel with a series resonator, which is different from one at the output side (that is, at the antenna side), such as the series resonator S3 at the input side. In the second filter 12, an inductor L2 (=2.0 nH) is connected in parallel with a series resonator, which is different from one at the input side (that is, at the antenna side), such as the series resonator S5 in the middle.

Preferably, at least one of the first and second filters 11 and 12 is provided with an inductor. Even more preferably, the filters 11 and 12 are provided with the inductors L1 and L2 respectively. When a plurality of inductors, for example, two inductors and one inductor are connected to the first filter 11 and the second filter 12, respectively, dielectric coupling and electromagnetic coupling tend to easily occur among the inductors. This may cause deterioration in attenuation characteristics.

By connecting an antenna-side terminal 11a of the first filter 11 and an antenna-side terminal 12a of the second filter 12 to an antenna terminal T5, the first filter 11 and the second filter 12 are electrically coupled.

Figure 3:
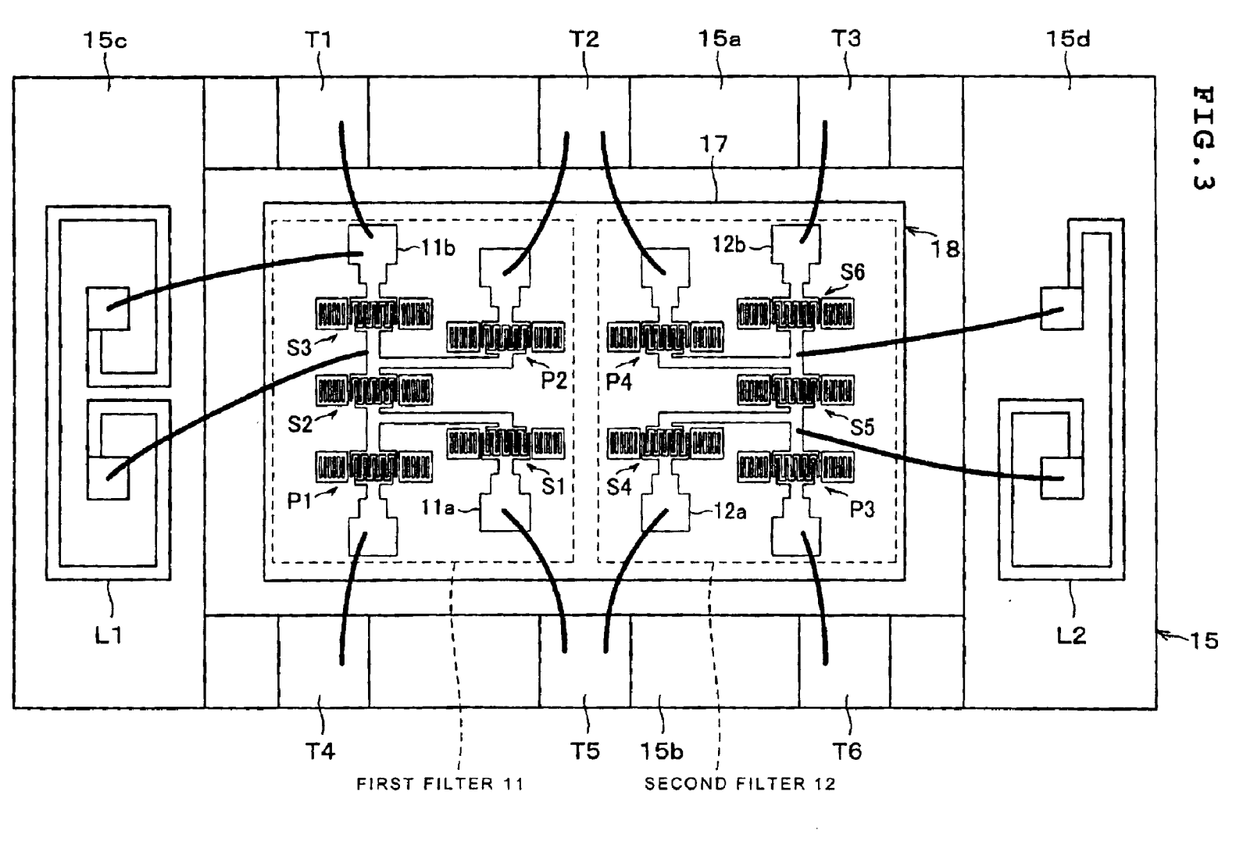
FIG. 3 is a plan view of the SAW duplexer.

A matching element including an inductor L3 (3 nH) and a capacitor C1 (2 pF) are connected at a coupling portion between the antenna 13 and the antenna terminal T5. As shown in FIG. 3, the inductors L1 and L2 are disposed in a package 15 (hereinafter, referred to as PKG), and the inductor L3 and the capacitor C1 are added as the external elements.

Each of the first filter 11 and the second filter 12 includes an electrode having a main constituent of Al on a piezoelectric substrate (64° LiNbO$_3$ substrate) 17 in which the propagation directions of the SAW of the resonators S1 to S6 and P1 to P4 are substantially parallel to one another and extend in the longitudinal direction of the piezoelectric substrate 17. The piezoelectric substrate 17 is preferably generally rectangular plate. The first filter 11, the second filter 12, and the piezoelectric substrate 17 define a SAW chip 18.

The PKG 15 includes electrically insulating ceramics, such as alumina, and has the appearance to have a generally rectangular parallelepiped box-shape with the bottom having an internal surface has the SAW chip 18 contained thereon. At this point, the SAW chip 18 is provided in the PKG 15 in the longitudinal direction. When the SAW chip 18 is placed inside the PKG 15, the inside of the PKG 15 may be enclosed with a cap (not shown).

In the PKG 15, ground terminals T2, T4, and T6, the antenna terminal T5, a signal terminal T1, and a signal terminal T3 are disposed on respective longer sides 15a and 15b. The signal terminal T1 is connected to the input terminal 11b of the first filter 11 and the signal terminal T3 is connected to the output terminal 12b of the second filter 12. The inductors L1 and L2 are disposed on shorter sides 15c and 15d of the inner periphery of the PKG 15 so as to face each other with the SAW chip 18 including the first filter 11 and the second filter 12 is sandwiched.

The terminals T1 to T6 are electrically conducted to the respective pads of the SAW chip 18 by wire bonding. The piezoelectric substrate 17 may be made of LiTaO$_3$, ZnO/S, or other suitable material in place of the above-described LiNbO$_3$. The inductors L1 and L2 may be disposed on corners of the inner periphery of the PKG 15 as long as they face each other with sandwiching the SAW chip 18 therebetween.

Next, advantages of the first preferred embodiment of the present invention will be described. The first filter 11 functions as the transmission filter having a relatively lower pass-band. The second filter 12 functions as the reception filter having a relatively higher pass-band. The antenna terminal T5 establishes an electrical connection between the first and second filters 11 and 12, and the impedance matching is obtained at approximately 50Ω with the external matching elements (e.g., the inductor L3 and capacitor C1).

For both the first filter 11 and the second filter 12, the inductors L1 and L2 are connected in parallel with series resonators not adjacent to the antenna, for example S3 and S5, respectively.

The series SAW resonator has the resonant and anti-resonant frequencies. When the inductor is connected in parallel with this SAW resonator, there can be obtained impedance characteristics having the anti-resonant frequency in a region higher than the resonant frequency and the anti-resonant frequency in a region lower than the resonant frequency.

Since the first filter 11 is the transmission filter, the attenuation of the region higher than the pass-band needs to be increased. The value of the connected inductor is therefore optimized so that the higher anti-resonant frequency occurring due to the added inductor has a desired value (for example, a lower side of the pass-band of the second filter 12, which is the reception filter).

Since, in the second filter 12 at the reception side, the attenuation of a region lower than the pass-band thereof must be increased, the value of the connected inductor is optimized so that the anti-resonant frequency occurring lower than the resonant frequency is caused to be a desired frequency.

At this point, since these inductors L1 and L2 are disposed on wire bond pad portions of the shorter sides 15c and 15d, respectively, in a position in which they face each other with the SAW chip 18 disposed therebetween in the longitudinal direction of the SAW chip 18, interference and coupling between the inductors L1 and L2 are minimized.

Figure 4:
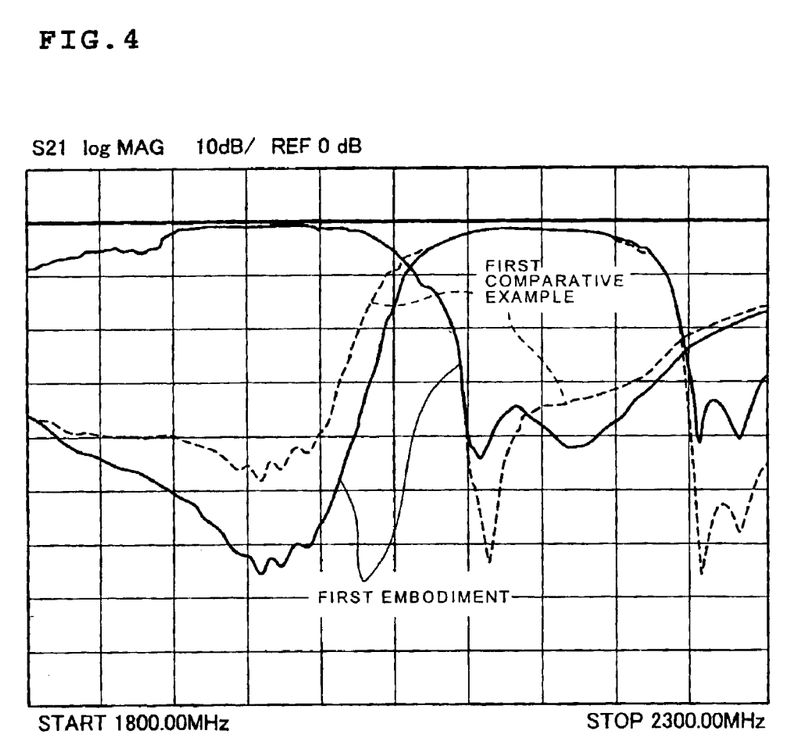
FIG. 4 is a graph showing insertion loss characteristics of the SAW duplexer according to the first preferred embodiment and a first comparative example.

To show more specific advantages, duplexer characteristics according to the first preferred embodiment and those excluding the parallel inductors L1 and L2 (first comparative example) are shown overlaid in FIG. 4. For the characteristics of the first preferred embodiment, by connecting the inductors L1 and L2 in parallel with the series resonators (such as S3 and S5), which are not on the antenna sides of the first filter 11 and the second filter 12, respectively, preferable characteristics (in particular, attenuation characteristics at the opposite side) can be observed over the characteristics with a construction excluding the parallel inductors.

Figure 5:
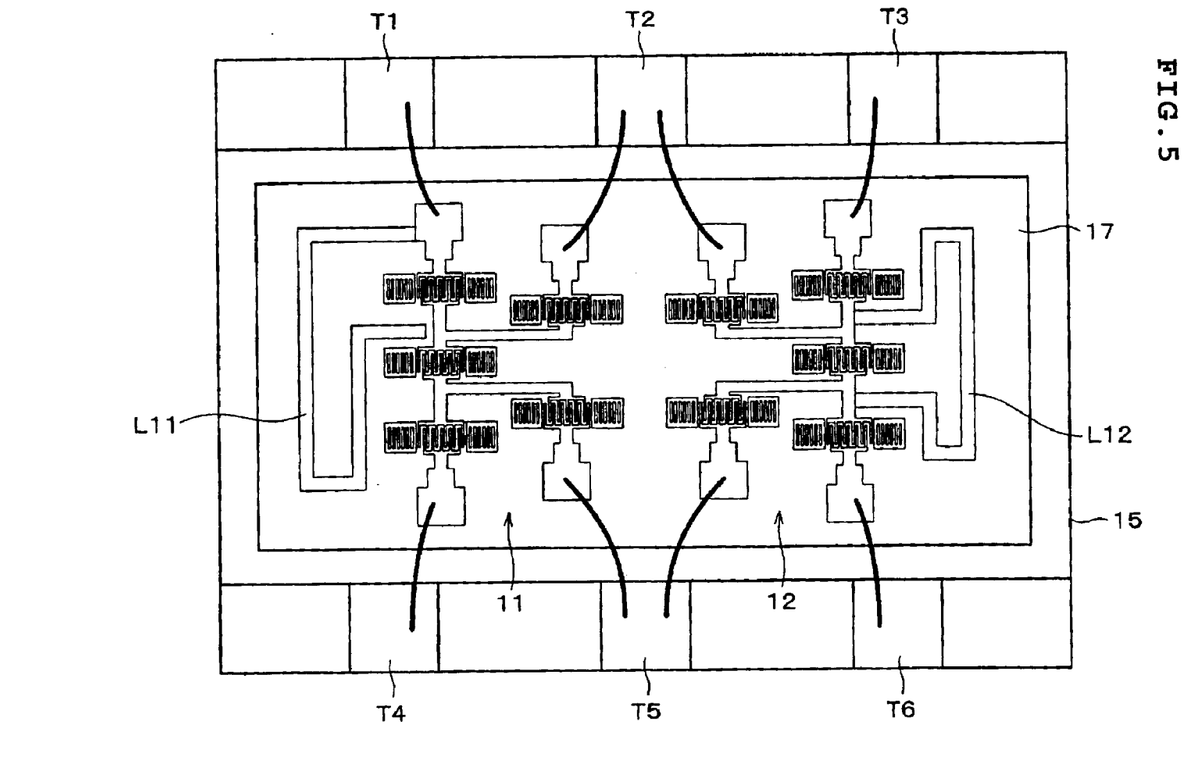
FIG. 5 is a plan view showing a second comparative example.
Figure 6:
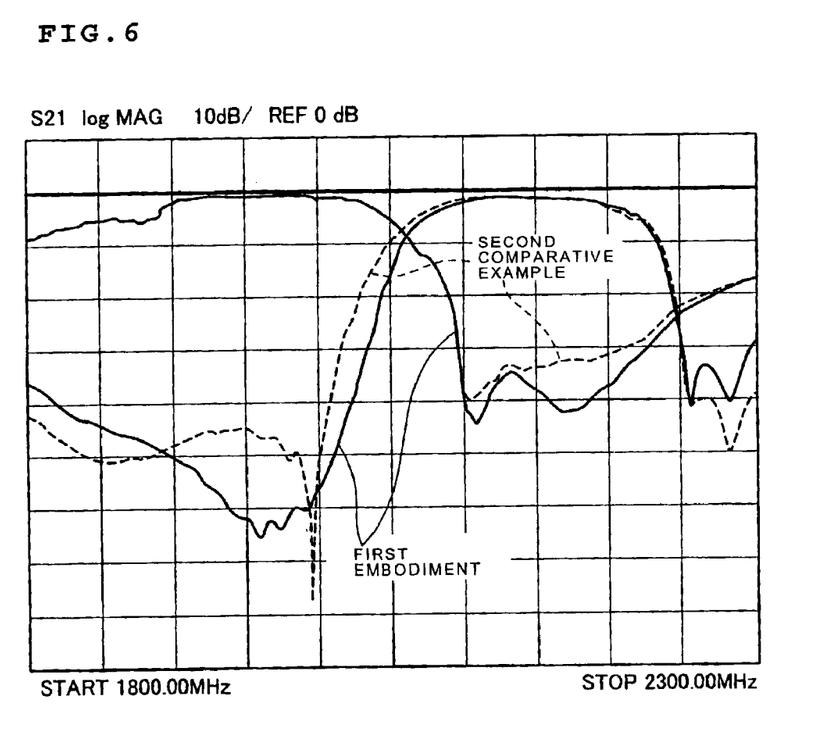
FIG. 6 is a graph showing insertion loss characteristics of the SAW duplexer according to the first preferred embodiment and a second comparative example.

Next, FIG. 6 illustrates comparison waveforms of transmission characteristics of the first preferred embodiment and a case (second comparative example) in which, as shown in FIG. 5, inductors L11 and L12 corresponding to the inductors L1 and L2, respectively, are disposed on the piezoelectric substrate (chip) 17.

In the second comparative example, since the inductors L11 and L12 are added on the piezoelectric substrate 17, dielectric coupling and electromagnetic coupling occur between the inductors L11 and L12. Comparing the second comparative example used in the duplexer with the first preferred embodiment, no achievement of the expected attenuation can be observed.

When the inductors L1 and L2 are disposed on the PKG 15, since characteristic deterioration due to dielectric coupling can be suppressed and minimized, as is shown in the first preferred embodiment, it is understood that the inductors L1 and L2 are preferably arranged so as to face each other with the SAW chip 18 disposed therebetween in the longitudinal direction of the SAW chip 18.

A SAW duplexer according to a second preferred embodiment of the present invention will be described. Since, as the SAW duplexer, the circuit components of the second preferred embodiment are the same as those of the first preferred embodiment, the descriptions thereof are omitted by assigning the same reference numerals thereto.

Figure 7:
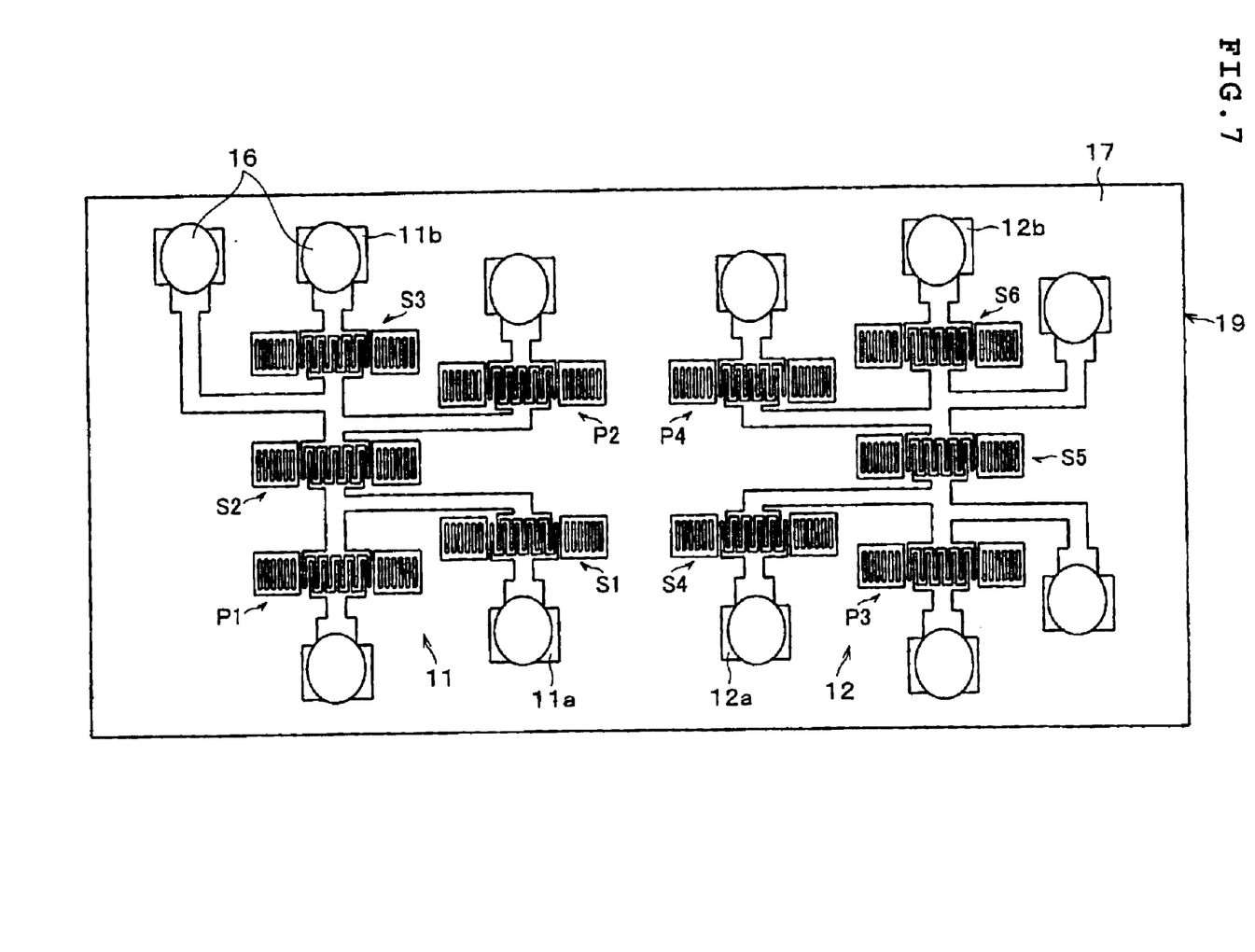
FIG. 7 is a plan view showing the SAW chip of a SAW duplexer according to a second preferred embodiment of the present invention.
Figure 8:
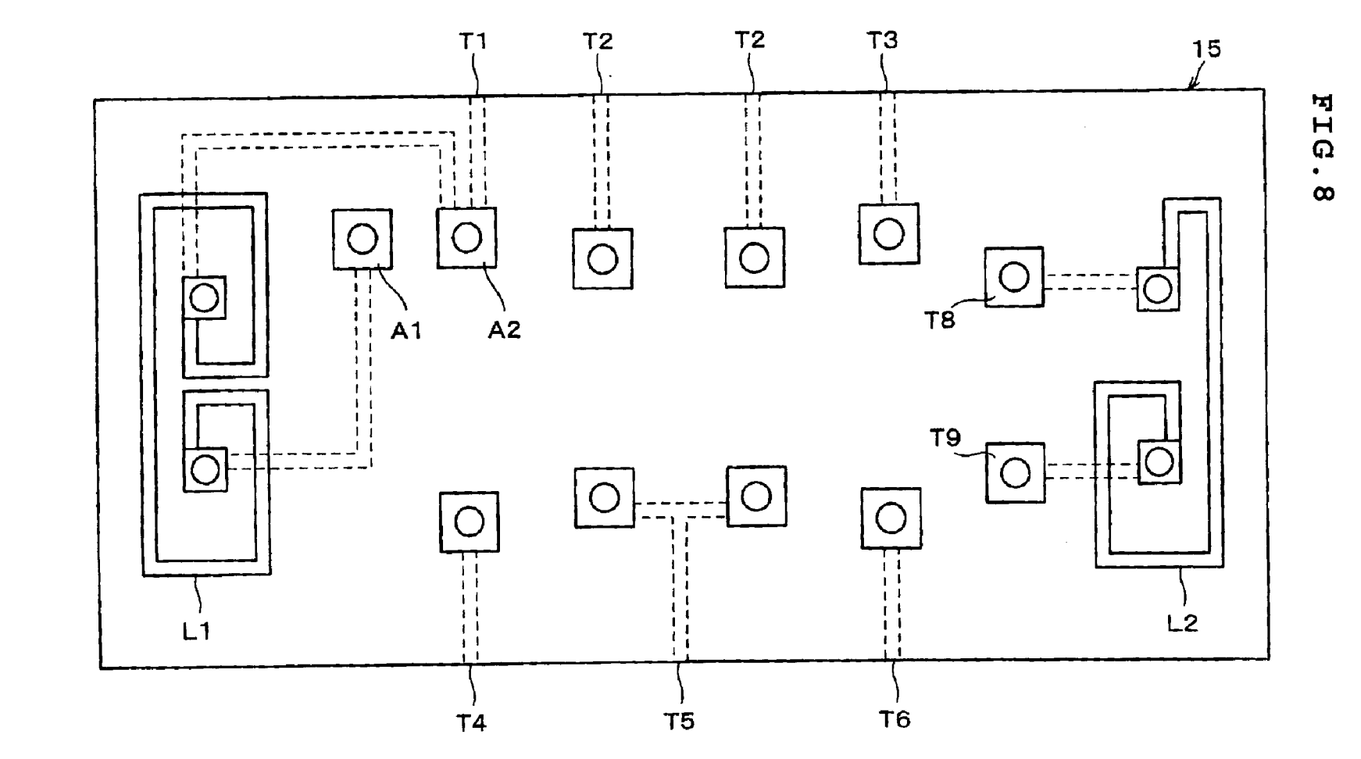
FIG. 8 is a plan view showing the PKG of the SAW duplexer.

In the SAW duplexer, the PKG 15 and a SAW chip 19 are bonded, as shown in FIGS. 7 and 8, with not wire bonding used in the first preferred embodiment but bump bonding using a bump 16. FIG. 7 is a view observing the SAW chip from above after bonding. The bump 16, which is preferably an Au bump, may be another material such as solder.

Figure 9:
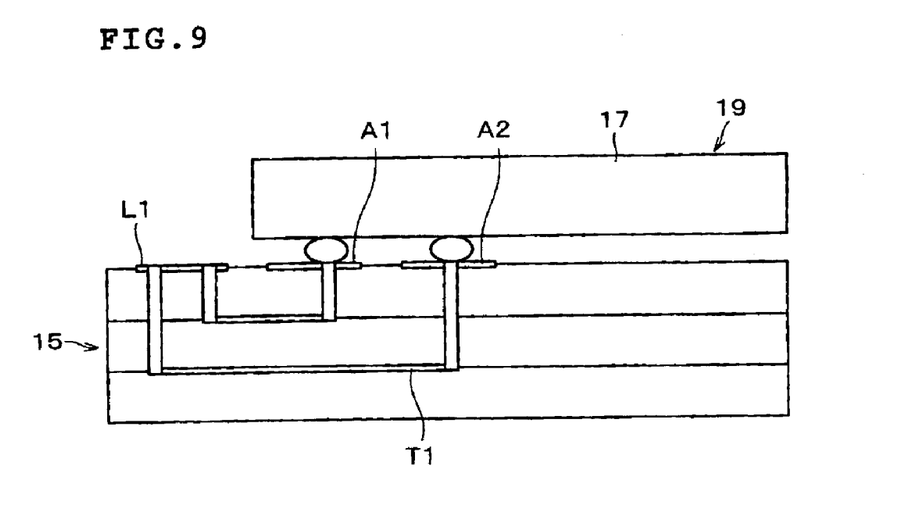
FIG. 9 is a cross-sectional view showing substantial portions of the PKG.

FIG. 8 shows a bump bonded surface of the PKG 15 according to the second preferred embodiment. The solid line pattern is a conductor pattern disposed on the bump bonded surfaces while the pattern drew with dashed line pattern is an internal conductor pattern disposed inside (the second layer, the third layer, or below). FIG. 9 shows a cross sectional view of the first filter 11(the left portion of the figure). The construction will be described using the first filter 11 as an example.

The series resonator S3 of the first filter 11 is connected in parallel with the inductor L1 in which one terminal of the series resonator S3 is connected to a PKG-side terminal A1 with a bump bond and the other terminal thereof is bonded with a PKG-side terminal A2 with a bump bond. Each of the terminals A1 and A2 is led through via-holes to an electrode that is lower than the bump bonded surface (the surface on which the SAW chip 19 is mounted) and once again is led through other via-holes to connect to the inductor pattern disposed on the bump bonded surface.

As described above, even when the connection is established via the bump bond, there is realized a construction in which, as observed from the top surface of the PKG 15, the inductors L1 and L2 are each disposed outside the mounted portion of the SAW chip 19 and in a position in which they face each other with the SAW chip 19 disposed therebetween. In the second preferred embodiment of the present invention, although the pattern leading to the inductors is implemented using the internal pattern, the pattern leading to the inductors may be implemented by leading the pattern directly to the inductors on the bump bonded surface when the required inductor is small.

In addition, the matching elements are used as the external elements in the first preferred embodiment. However, when the matching elements are incorporated inside the PKG 15, the PKG 15 may have a multi-layer construction with the matching elements disposed on a layer lower than the mounted portion of the SAW chip 18 or 19. In this case, electromagnetic coupling and the like between the inductors added to the matching element and to the series resonators can be minimized, thus realizing filter characteristics having preferable attenuation and isolation.

In the second preferred embodiment having such modifications, the same advantages as in the above-described first preferred embodiment can be obtained as well. In each of the above-described preferred embodiments, there are described the examples in which series resonators are provided to the input and output terminals of the first and second filters 11 and 12, respectively. However, the SAW resonators may be each provided as follows: parallel, series, parallel, series, and parallel, for example. In this case, an inductor may be connected to any of the series resonators.

Here, the "periphery" indicates the area occupied by the longer sides 15a and 15b and the shorter sides 15c and 15d.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave duplexer comprising:
   a first filter including a plurality of surface acoustic wave resonators arranged in a ladder configuration;
   a second filter including a plurality of surface acoustic wave resonators arranged in a ladder configuration, the second filter having a pass band that is different from that of the first filter; and
   at least one inductor connected in parallel with one of the resonators of the first and second filters except a resonator closest to the output side of the first filter and except a resonator closest to the input side of the second filter;
   wherein the first filter is a transmission filter and the second filter is a reception filter.

2. A surface acoustic wave duplexer according to claim 1, further comprising a package for accommodating a surface acoustic wave chip including the first filter and the second filter.

3. A surface acoustic wave duplexer according to claim 2, wherein said at least one inductor includes first and second inductors arranged to face each other in an inner periphery of the package so as to sandwich the surface acoustic wave chip.

4. A surface acoustic wave duplexer according to claim 3, wherein the first inductor and the second inductor face each other on inner sides of the package so as to sandwich the surface acoustic wave chip.

5. A surface acoustic wave duplexer according to claim 3, wherein the first inductor and the second inductor face each other on inner corners of the package so as to sandwich the surface acoustic wave chip.

6. A surface acoustic wave duplexer according to claim 3, wherein the first inductor and the second inductor are disposed outside a mounted portion of the surface acoustic wave chip in the package.

7. A surface acoustic wave duplexer according to claim 3, further comprising:
an antenna signal terminal located in a position of the package where neither the first inductor nor the second inductor is disposed; and
a signal transmission terminal and a signal reception terminal located in a position of the package so as to face the antenna signal terminal.

8. A surface acoustic wave duplexer according to claim 7, wherein:
the package has a substantially rectangular parallelepiped shape having shorter sides and longer sides with the antenna signal terminal provided at one of the longer sides, the signal transmission terminal and the signal reception terminal provided at the other longer side, the first inductor is connected in parallel with one of the series resonators of the first filter on one of the shorter sides, and the second inductor is connected in parallel with one of the series resonators of the second filter on the other shorter side.

9. A surface acoustic wave duplexer according to claim 3, further comprising a wire bonding portion for electrically bonding the package and the surface acoustic wave chip.

10. A surface acoustic wave duplexer according to claim 3, further comprising a bump bonding portion for electrically bonding the package and the surface acoustic wave chip.

11. A surface acoustic wave duplexer according to claim 3, further comprising a matching element at an antenna-coupling terminal wherein:
the package has a multi-layer structure; and
the matching element is provided at a layer that is lower than a mounted portion of the surface acoustic wave chip in the package.

12. A surface acoustic wave duplexer according to claim 1, wherein at least one of the first and second filters comprises at least three series resonators.

13. A communication apparatus comprising:
a surface acoustic wave duplexer including:
a first filter including a plurality of surface acoustic wave resonators arranged in a ladder configuration;
a second filter including a plurality of surface acoustic wave resonators arranged in a ladder configuration, the second filter having a pass band that is different from that of the first filter; and
at least one inductor connected in parallel with one of the resonators of the first and second filters except a resonator closest to the output side of the first filter and except a resonator closest to the input side of the second filter;
wherein the first filter is a transmission filter and the second filter is a reception filter.

14. A surface acoustic wave duplexer comprising:
a first filter including a plurality of surface acoustic wave resonators including a series resonator and a parallel resonator having a ladder shape configuration;
a second filter including a plurality of surface acoustic wave resonators including a series resonator and a parallel resonator having a ladder configuration, the second filter having a pass band that is different from that of the first filter;
a first inductor connected in parallel with one of the series resonators of the first filter; and
a second inductor connected in parallel with one of the series resonators of the second filter; wherein
the first filter is a transmission filter and the second filter is a reception filter; and
the first inductor is connected with a series resonator except a series resonator closest to the output side of the first filter, and the second inductor is connected with a series resonator except a series resonator closest to the input side of the second filter.

15. A surface acoustic wave duplexer according to claim 14, further comprising a package for accommodating a surface acoustic wave chip including the first filter and the second filter, the first and second inductors being arranged to face each other in an inner periphery of the package so as to sandwich the surface acoustic wave chip.

16. A surface acoustic wave duplexer according to claim 15, wherein the first inductor and the second inductor face each other on inner sides of the package so as to sandwich the surface acoustic wave chip.

17. A surface acoustic wave duplexer according to claim 15, wherein the first inductor and the second inductor face each other on inner corners of the package so as to sandwich the surface acoustic wave chip.

18. A surface acoustic wave duplexer according to claim 15, wherein the first inductor and the second inductor are disposed outside a mounted portion of the surface acoustic wave chip in the package.

19. A surface acoustic wave duplexer according to claim 15, further comprising:
an antenna signal terminal located in a position of the package where neither the first inductor nor the second inductor is disposed; and
a signal transmission terminal and a signal reception terminal located in a position of the package so as to face the antenna signal terminal.

20. A surface acoustic wave duplexer according to claim 19, wherein:
the package has a substantially rectangular parallelepiped shape having shorter sides and longer sides with the antenna signal terminal provided at one of the longer sides, the signal transmission terminal and the signal reception terminal provided at the other longer side, the first inductor is connected in parallel with one of the series resonators of the first filter on one of the shorter sides, and the second inductor is connected in parallel with one of the series resonators of the second filter on the other shorter side.

21. A surface acoustic wave duplexer according to claim 15, further comprising a wire bonding portion for electrically bonding the package and the surface acoustic wave chip.

22. A surface acoustic wave duplexer according to claim 15, further comprising a bump bonding portion for electrically bonding the package and the surface acoustic wave chip.

23. A surface acoustic wave duplexer according to claim 15, further comprising a matching element at an antenna-coupling terminal wherein:
the package has a multi-layer structure; and
the matching element is provided at a layer that is lower than a mounted portion of the surface acoustic wave chip in the package.

24. A surface acoustic wave duplexer according to claim 14, wherein at least one of the first and second filters comprises at least three series resonators.

25. A communication apparatus comprising:
a surface acoustic wave duplexer including:
- a first filter including a plurality of surface acoustic wave resonators including a series resonator and a parallel resonator having a ladder configuration;
- a second filter including a plurality of surface acoustic wave resonators including a series resonator and a parallel resonator having a ladder configuration, the second filter having a pass band that is different from that of the first filter;
- a first inductor connected in parallel with one of the series resonators of the first filter; and
- a second inductor connected in parallel with one of the series resonators of the second filter; wherein the first filter is a transmission filter an the second filter is a reception filter; and the first inductor is connected with a series resonator except a series resonator closest to the output side of the first filter, and the second inductor is connected with a series resonator except a series resonator closest to the input side of the second filter.

* * * * *